(12) United States Patent
Erb et al.

(10) Patent No.: US 7,157,795 B1
(45) Date of Patent: Jan. 2, 2007

(54) COMPOSITE TANTALUM NITRIDE/TANTALUM COPPER CAPPING LAYER

(75) Inventors: Darrell M. Erb, Los Altos, CA (US); Steven C. Avanzino, Cupertino, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/934,511

(22) Filed: Sep. 7, 2004

(51) Int. Cl.
*H01L 23/48* (2006.01)

(52) U.S. Cl. .................. 257/751; 257/E23.16; 438/627; 438/643; 438/653; 438/927

(58) Field of Classification Search ................ 257/751, 257/E23.16; 438/627, 643, 653, 927
See application file for complete search history.

(56) References Cited

U.S. PATENT DOCUMENTS

| | | | |
|---|---|---|---|
| 6,157,081 A * | 12/2000 | Nariman et al. ............ 257/752 |
| 6,229,211 B1 * | 5/2001 | Kawanoue et al. ......... 257/751 |
| 6,339,258 B1 * | 1/2002 | Cooney et al. ............. 257/762 |
| 6,437,440 B1 * | 8/2002 | Cabral et al. ............... 257/751 |
| 6,475,909 B1 * | 11/2002 | Uozumi ...................... 438/678 |
| 6,555,461 B1 * | 4/2003 | Woo et al. .................. 438/622 |
| 6,706,625 B1 * | 3/2004 | Sudijono et al. ........... 438/637 |
| 6,723,635 B1 * | 4/2004 | Ngo et al. ................... 438/627 |
| 2002/0006468 A1 * | 1/2002 | Paranjpe et al. .............. 427/96 |
| 2003/0001271 A1 * | 1/2003 | Uozumi ...................... 257/758 |
| 2003/0089597 A1 | 5/2003 | Tang et al. |
| 2004/0131878 A1 * | 7/2004 | Seet et al. ................... 428/641 |
| 2004/0248403 A1 * | 12/2004 | Dubin et al. ................ 438/637 |
| 2005/0001325 A1 * | 1/2005 | Andricacos et al. ........ 257/762 |
| 2005/0118796 A1 * | 6/2005 | Chiras et al. ............... 438/618 |

\* cited by examiner

*Primary Examiner*—Eugene Lee

(57) ABSTRACT

Electromigration and stress migration of Cu interconnects are significantly reduced by forming a composite capping layer comprising a layer of tantalum nitride on the upper surface of the inlaid Cu and a layer of α-Ta on the titanium nitride layer. Embodiments include forming a recess in an upper surface of an upper surface of Cu inlaid in a dielectric layer, depositing a layer of titanium nitride of a thickness of 20 Å to 100 Å and then depositing a layer of α-Ta at a thickness of 200 Å to 500 Å.

19 Claims, 12 Drawing Sheets

COMPOSITE TANTALUM NITRIDE/TANTALUM COPPER CAPPING LAYER

FIELD OF THE INVENTION

The present invention relates to copper (Cu) and/or Cu alloy metallization in semiconductor devices, and to a method for forming reliably capped Cu or Cu alloy interconnects. The present invention is particularly applicable to manufacturing high speed integrated circuits having submicron design features, and high conductivity interconnects with improved electromigration resistance and improved stress migration resistance.

BACKGROUND ART

The escalating requirements for high density and performance associated with ultra large scale integration semiconductor wiring require responsive changes in interconnection technology. Such escalating requirements have been found difficult to satisfy in terms of providing a low R×C (resistance×capacitance) interconnect pattern with electromigration resistance, particularly wherein submicron vias, contacts and trenches have high aspect ratios imposed by miniaturization. High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases.

As device features plunge into the deep submicron regime, interconnect technology is transitioning from aluminum-based to copper-based metallurgy. This technological evolution has come about through the adoption of damascene and dual-damascene process flows involving electrolytic copper-plating and chemical mechanical polishing (CMP) techniques. The technological benefits of Cu, such as reduced R×C delay are clear; however, various reliability issues have evolved. For example, due to Cu diffusion through interlayer dielectric materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer, such as TaN, lining the opening and on the surface of the interlayer dielectric, filling the opening with Cu or a Cu alloy layer, CMP, and forming a silicon nitride capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing electromigration and stress migration resistance.

It has been proposed to employ a tantalum (Ta) layer to cap inlaid Cu metallization. Such a process flow is schematically illustrated in FIGS. 1A through 1G. Adverting to FIG. 1A, a dielectric layer 11 is formed over a substrate 10. An opening 12 is then formed in dielectric layer 11 as illustrated in FIG. 1B. Subsequently, a diffusion barrier layer 13, such as Ta or tantalum nitride is then deposited to line the opening and Cu or a Cu alloy 14 deposited filling the opening and forming an overburden as illustrated in FIG. 1C. CMP is then implemented forming inlaid Cu having an upper surface substantially coplanar with the upper surface of dielectric layer 11 as illustrated in FIG. 1D.

Adverting to FIG. 1E, a recess 16 is formed in Cu layer 15. An impetus to employing Ta as a capping layer for inlaid Cu is an improvement in electromigration and stress migration performance. It was experimentally determined that the amount of Ta on top of copper to yield the electromigration benefit is only 40 Å. However, to reliably ensure that this minimum thickness of Ta is present on all Cu lines subsequent to CMP, it is necessary to etch a recess (16 in FIG. 1E) into the Cu to approximately 400 Å and subsequently deposit about the same thickness of Ta. Because of dishing effects for wide Cu lines, Ta will be thinned more on the wide lines resulting in nearly full thickness of Ta on the narrow lines and less than 100 Å on the wide lines, thereby meeting the minimum thickness requirement of 40 Å.

Adverting to FIG. 1F, a layer of Ta 17 is deposited filling the recess and forming an overburden. Subsequently, CMP is implemented forming Ta capping layer 18 having an upper surface substantially coplanar with the upper surface of dielectric layer 11 as illustrated in FIG. 1G. Subsequent processing may be implemented in a conventional manner, as by depositing overlying dielectric layers and forming vias in electrical contract to the Ta copper lines.

A disadvantage of the Ta capping layer approach is an increase in via resistance which would detract from the benefit of the Ta capping layer compared to not having a capping layer. If the Ta capping layer is etched away over the inlaid Cu in the area of the via during the subsequent via etch processing steps, several problems evolve, such as additional processing and attendant increased manufacturing costs, via corner bevelling and Cu contamination.

Accordingly, there exists a need for methodology enabling the fabrication of semiconductor devices having reliably capped Cu interconnect Cu features with reduced via resistance and improved electromigration and stressed migration performance.

DISCLOSURE OF THE INVENTION

An advantage of the present invention is a method of manufacturing a semiconductor device having highly reliable capped Cu or Cu alloy interconnect with reduced interconnect capacitance and improved electromigration and stress migration performance.

Another advantage of the present invention is a semiconductor device comprising a reliably capped Cu or Cu alloy interconnect member with reduced interconnect capacitance and improved electromigration and stress migration performance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in the first dielectric layer; filling the opening with copper (Cu) or a Cu alloy; and forming a composite capping layer on the Cu or Cu alloy, the composite capping layer comprising: a layer of tantalum nitride on an upper surface of the Cu or Cu alloy; and a layer of alpha ($\alpha$)-Ta on the layer of tantalum nitride.

Another advantage of the present invention is a semiconductor device comprising: a first dielectric layer over a substrate; copper (Cu) or a Cu alloy inlaid in the first dielectric layer; and a composite capping layer on the inlaid Cu or Cu alloy, the composite capping layer comprising: a layer of tantalum nitride on the inlaid Cu or Cu alloy; and a layer of alpha ($\alpha$)-tantalum (Ta) on the layer of tantalum nitride.

Embodiments of the present invention include depositing the tantalum nitride layer at a thickness of 20 Å to 100 Å and depositing the $\alpha$-Ta layer at a thickness of 200 Å to 500 Å, each by physical vapor deposition, particularly by an ionized sputtering deposition (ISD) technique. Embodiments of the present invention further include depositing the layer of tantalum nitride under conditions such that unreacted Ta is initially formed at the interface thereby improving bonding of the titanium nitride to the inlaid Cu. Subsequent processing in accordance with the present invention includes forming a second dielectric layer over the first dielectric layer, forming an opening therein, lining the opening with a diffusion barrier layer and filling the opening with Cu to form a via or a dual damascene structure comprising a via with an overlying line.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1A:
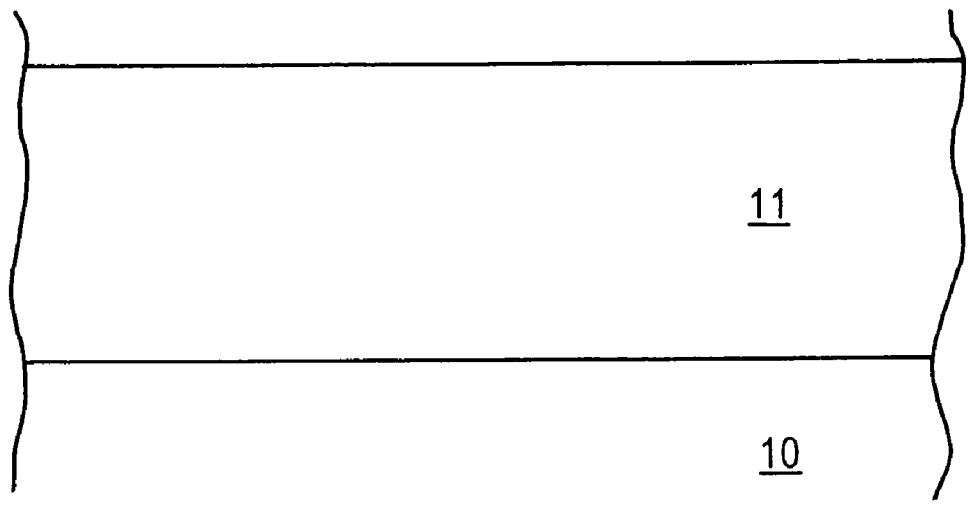
FIGS. 1A–1G schematically illustrate sequential phases in accordance with a conventional method.
Figure 1B:
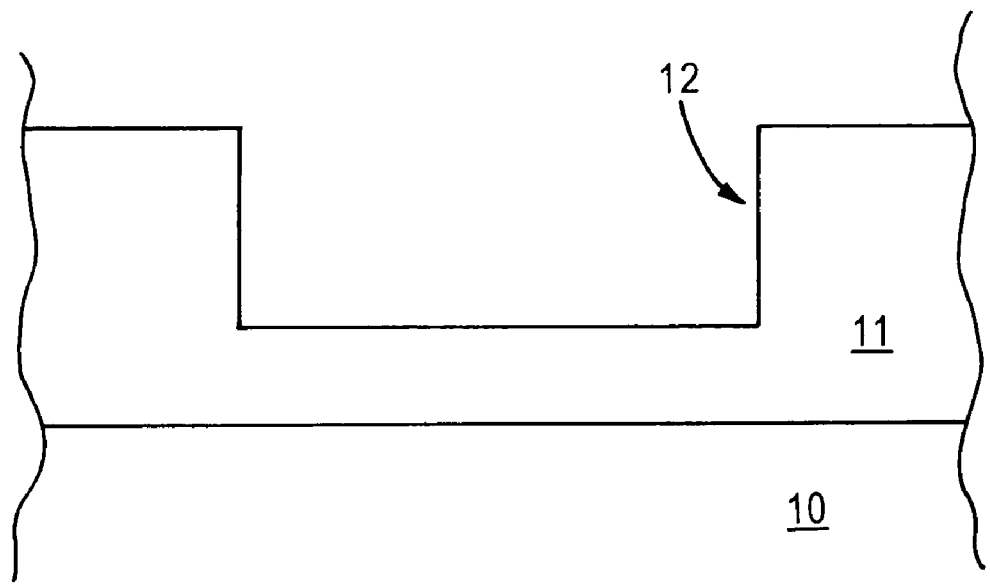
Figure 1C:
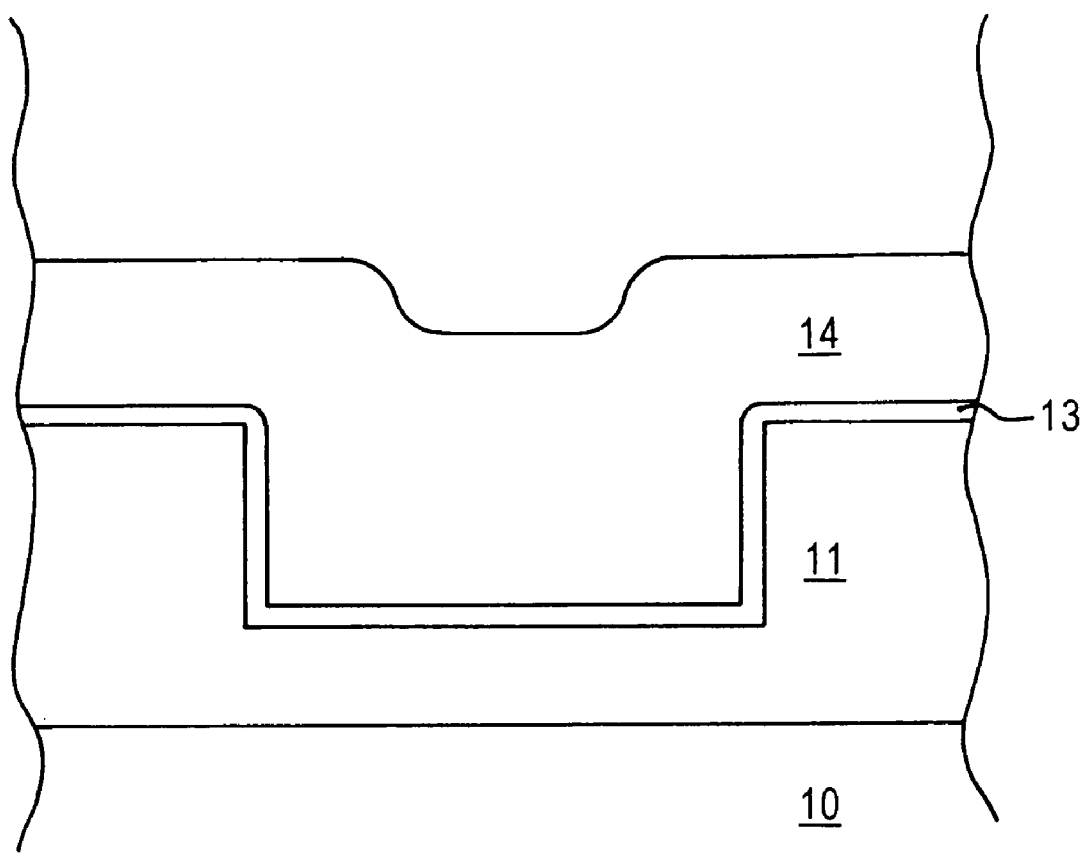
Figure 1D:
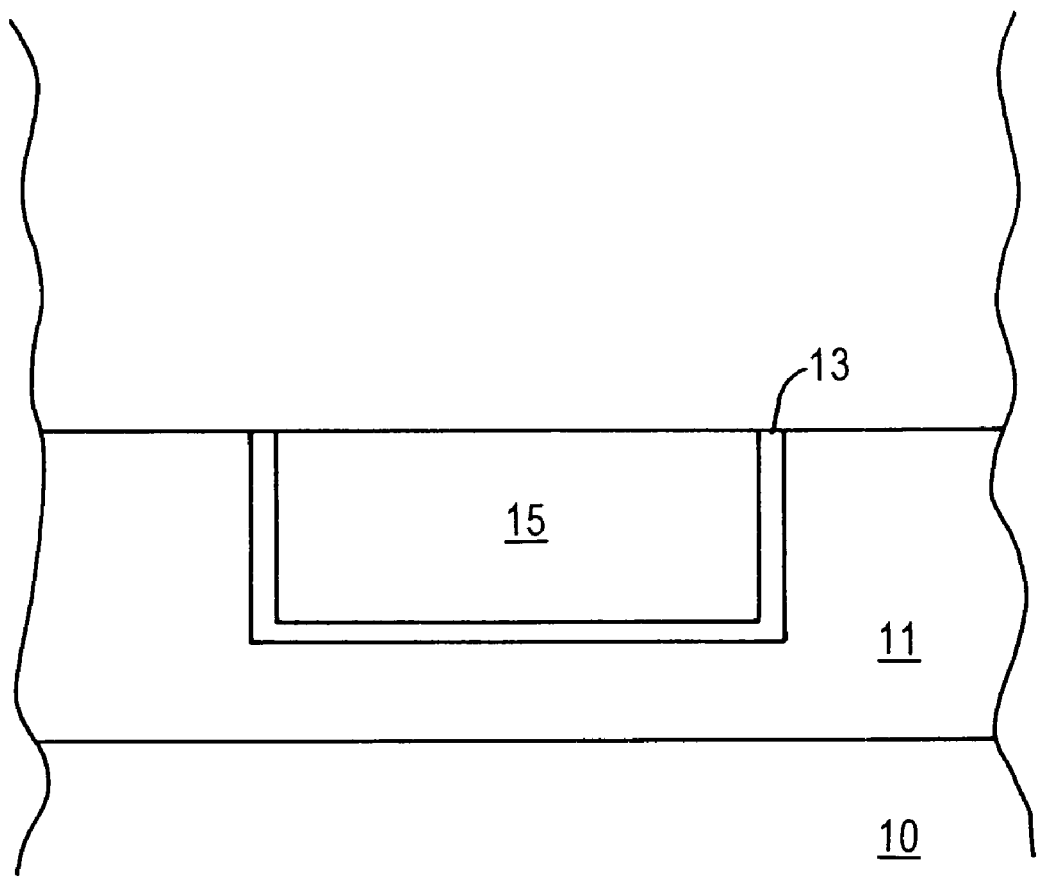

Conventional methodology for fabricating semiconductor devices with capped inlaid Cu are accompanied by via resistance, electromigration and stress migration problems. In copending application Ser. No. 10/791,904, filed on Mar. 4, 2004 such problems are addressed by forming a composite capping layer comprising a thin layer of beta ($\beta$)-Ta on an upper surface of the inlaid Cu, a thin layer of tantalum nitride on the layer of $\beta$-Ta and a layer of $\alpha$-Ta on the thin titanium nitride layer. The resulting interconnect structure exhibits reduced via resistance, reduced voiding under the via, improved stress migration performance and improved electromigration performance. Further, by avoiding the need to remove the Ta layer, which in itself is difficult, slow and unproven, manufacturing throughput is increased, manufacturing costs decreased, beveling of via corners avoided and Cu contamination reduced.

The present invention constitutes an improvement over the invention disclosed on copending application Ser. No. 10/791,904 by providing simplified methodology while obtaining the benefits of the tri-layer composite capping layer film disclosed therein. The present invention provides a bi-layer composite capping layer comprising tantalum nitride directly on an upper surface of inlaid Cu, and a layer $\alpha$-Ta on the tantalum nitride. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

Prior to experimentation and investigation, it was not known whether the requisite electromigration improvement could be obtained by depositing tantalum nitride directly on the inlaid Cu. In order to have good electromigration properties, there must be good bonding between the inlaid Cu and the deposited tantalum nitride. If bonding is weak, Cu atoms can freely migrate along the Cu/dielectric interface, which appears to be the dominant electromigration failure mechanism. It was recognized that when Cu is deposited on sputter-deposited tantalum nitride films, poor adhesion results and electromigration performance poor. However, when tantalum nitride is deposited on Cu, good adhesion is achieved, believed to be attributed in part to unreacted tantalum generated during the deposition process.

Accordingly, embodiments of the present invention include depositing tantalum nitride under conditions such that some unreacted Ta is initially deposited at the interface between the inlaid copper and tantalum nitride. In accordance with embodiments of the present invention, the layer of tantalum nitride is deposited employing argon and nitrogen gas under a plasma power. The layer of tantalum nitride may be deposited employing an argon flow rate of 5 to 40 sccm, e.g., 15 sccm, and a nitrogen flow rate of 10 to 100 sccm, e.g., 20 sccm, a DC power of 1 KW to 22 KW, e.g., 1 KW and no RF bias, for about 2 to 10 seconds resulting in a layer of tantalum nitride of 20 Å to 100 Å directly on the inlaid Cu forming an interface between.

A small amount of unreacted Ta can be formed at the interface by various measures. For example, the initial sputter of pure Ta can be effected by igniting the plasma prior to turning on and stabilizing the nitrogen flow rate, or turning on and stabilizing the argon flow rate for a period of time before the DC power is turned on to start the plasma followed by turning on the nitrogen flow rate. In another approach, the argon is turned on and then the nitrogen is turned on at the same time the DC power is turned on. In this way some unreacted Ta will appear at the interface and facilitate bonding of the tantalum nitride layer directly to the underlying Cu, thereby eliminating the initial step of forming a layer of β-Ta, as in the methodology of copending application Ser. No. 10/791,904 and, consequently, reducing manufacturing costs and increasing manufacturing throughput by providing simplified methodology.

Figure 1E:
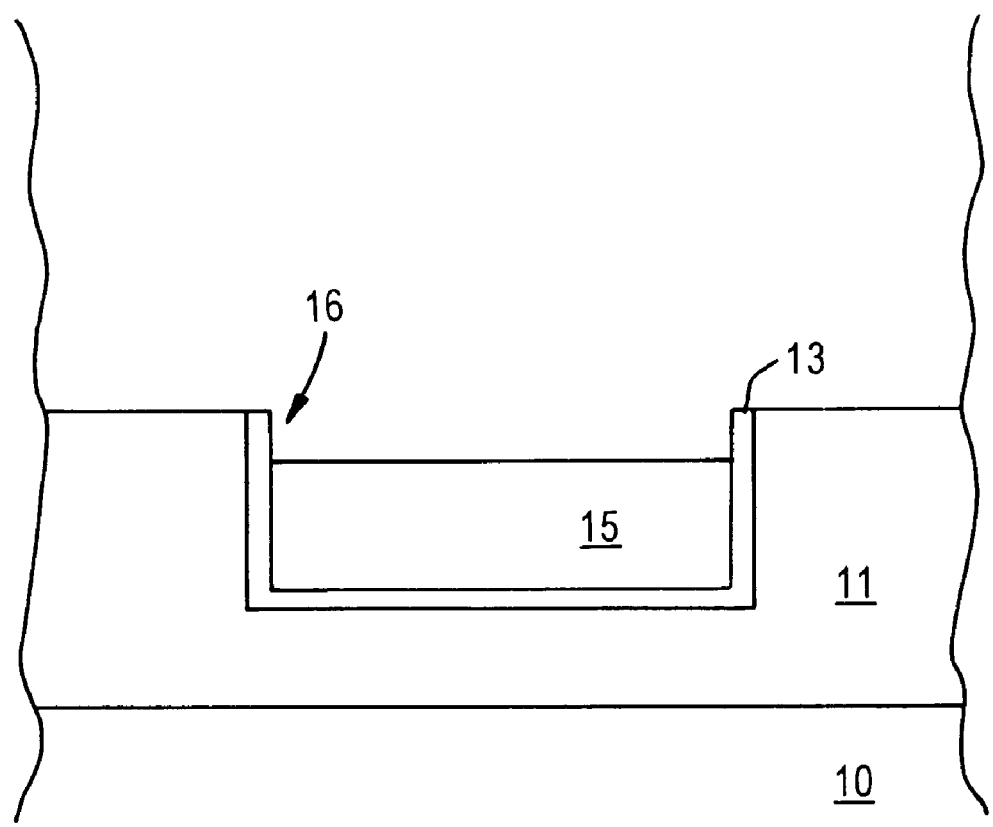
Figure 1F:
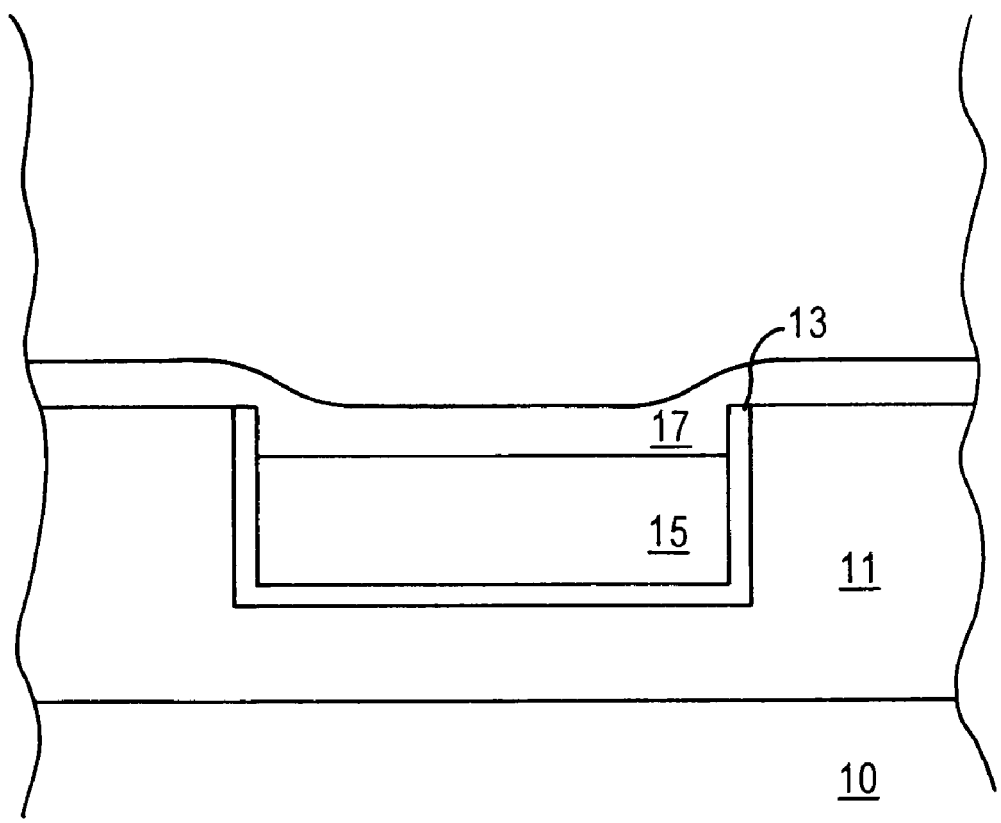
Figure 1G:
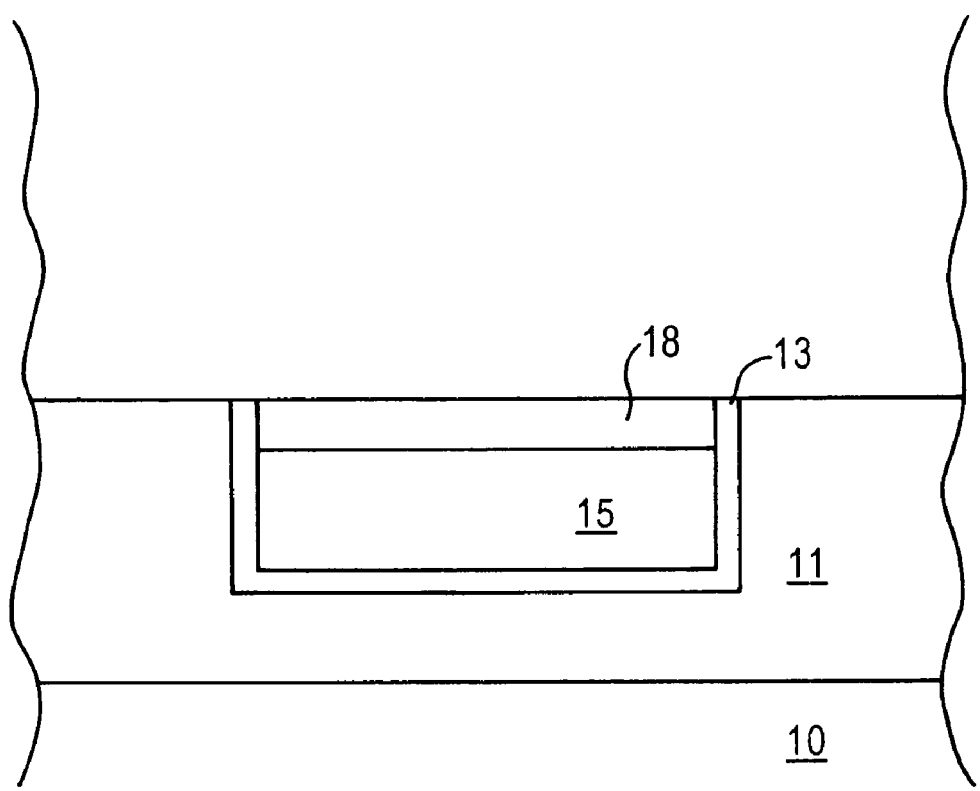
Figure 2A:
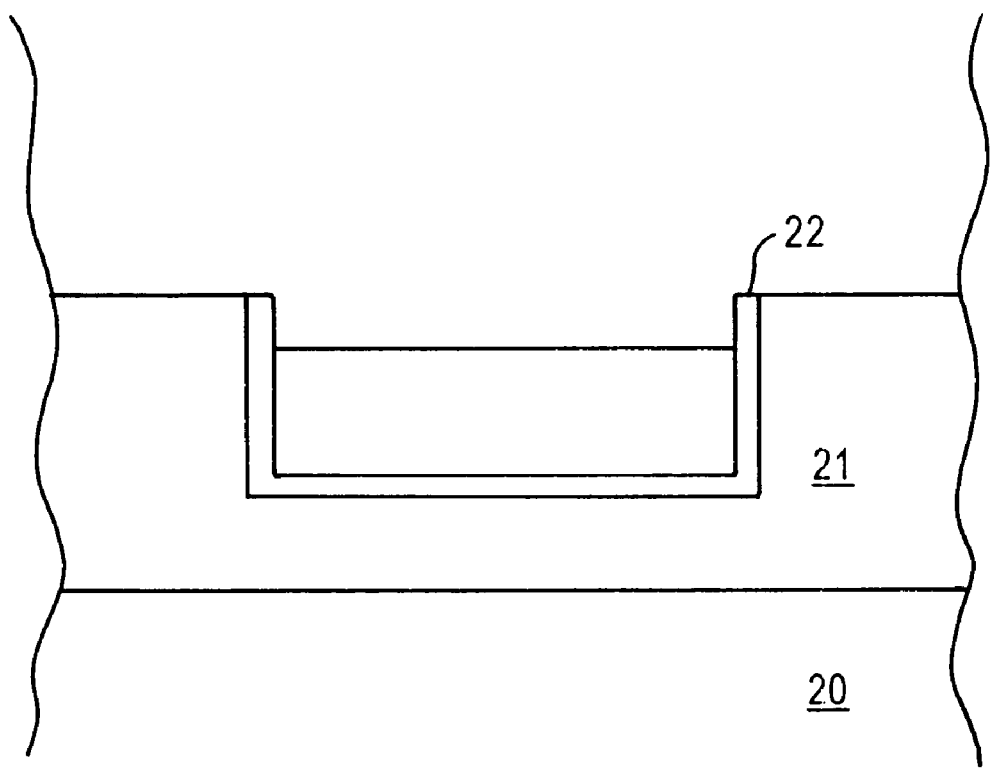
FIGS. 2A–2E schematically illustrate sequential phases of a method in accordance with an embodiment of the present invention.
Figure 2B:
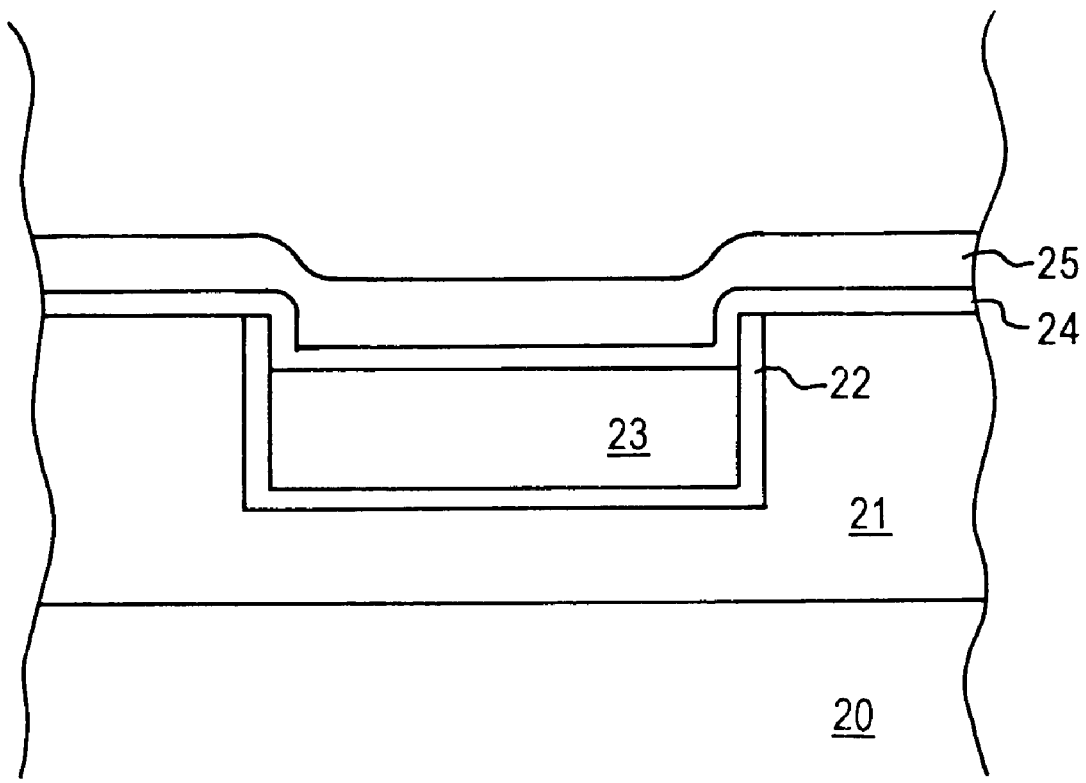

An embodiment of the present invention is schematically illustrated in FIGS. 2A–2E. A structure is initially formed as shown in FIG. 2A which basically corresponds to the structure illustrated in FIG. 1E formed by conventional methodology and comprises substrate 20, first dielectric layer 21 formed thereon, diffusion barrier liner 22, such as Ta or tantalum nitride, inlaid Cu 23 or a recess 24 which reduces the upper surface of the inlaid Cu below the upper surface of the first dielectric layer 21, as by about 400 Å. Subsequently, as shown in FIG. 2B, a layer of tantalum nitride 24 is deposited followed by a layer of α-Ta 25. The α-Ta layer 25 may be deposited after depositing of a thin tantalum nitride layer 24 by turning off the nitrogen flow and completely pumping out the chamber. Argon gas at a flow rate of 5 to 40 sscm, e.g., 15 sccm, is introduced into the same deposition chamber and a DC power of about 22 KW is applied for about 12 seconds on the pristine tantalum nitride substrate resulting in the formation of a layer of α-Ta of about 200 Å to 500 Å, e.g., layer of 50 Å. In order to assure that the surfaces remain free of contaminants, the vacuum base pressure of the sputtering system is maintained less than about $10^{-7}$ Torr. Advantageously, the layer of α-Ta has a reduced resistivity of 15 to 30 micro-ohm-cm vis-à-vis a resistivity of 150 to 220 micro-ohm-cm for β-Ta. The layer of α-Ta forms because it is deposited directly on an atomically clean sputter-deposited layer of tantalum nitride.

Figure 2C:
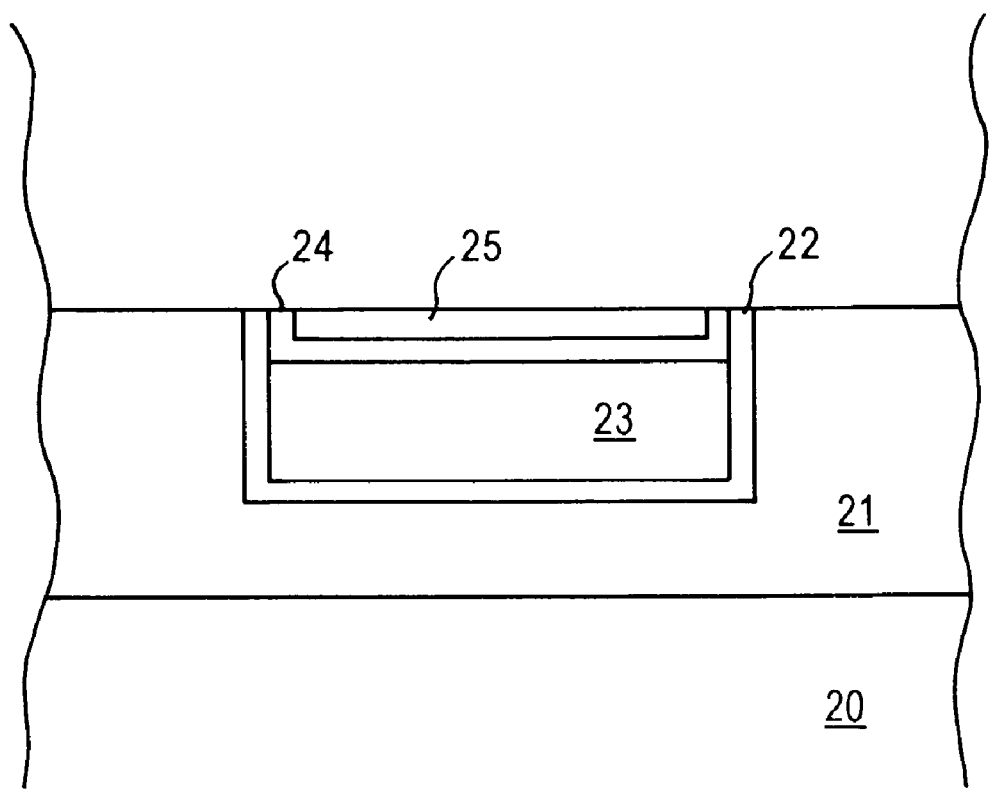
Figure 2D:
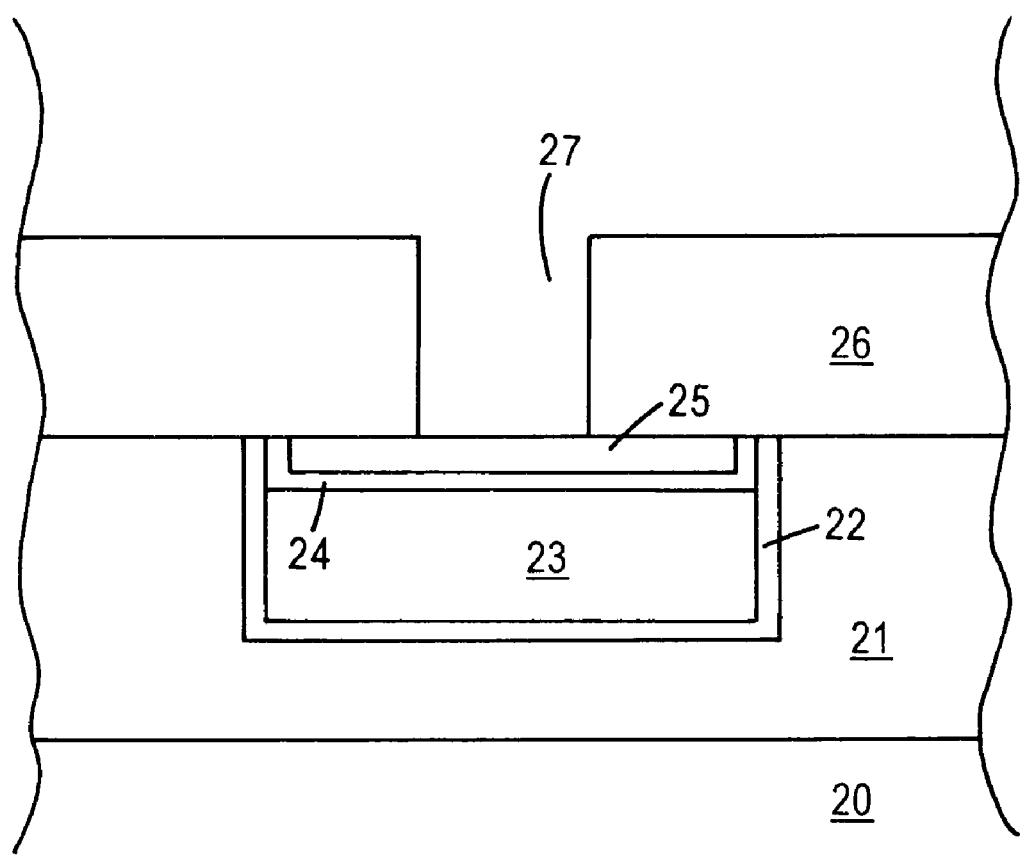
Figure 2E:
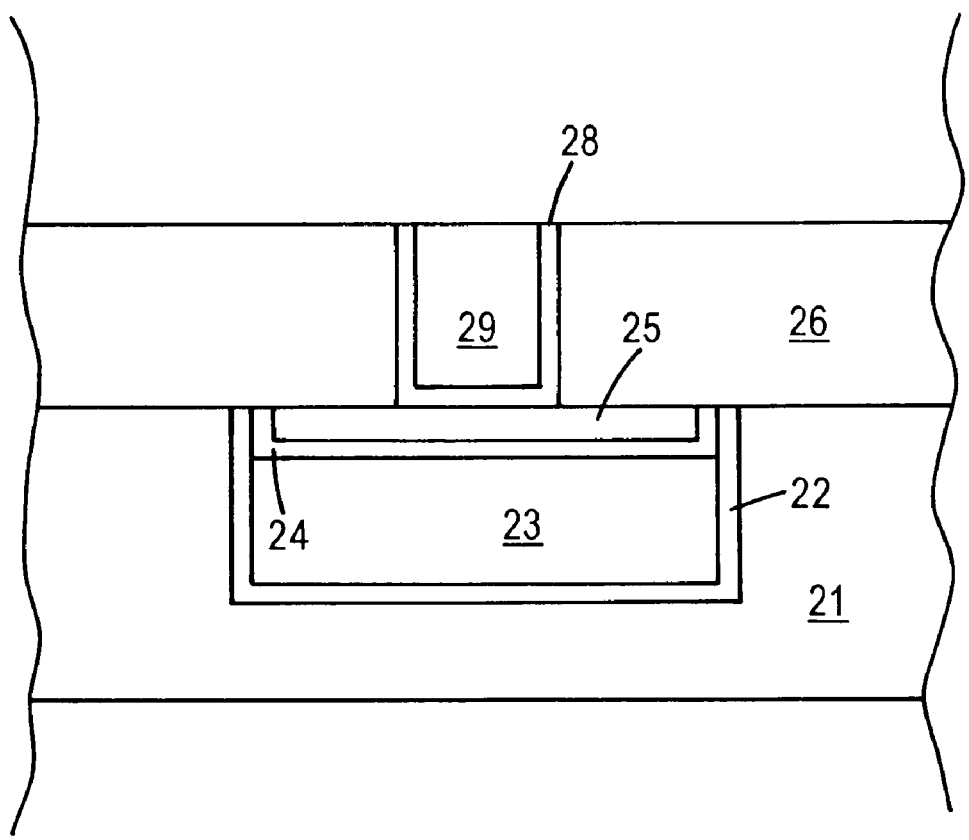

Subsequently, as illustrated in FIG. 2C, CMP is implemented such that the upper surface of the α-Ta layer 25 is substantially coplanar with the upper surface of the first dielectric layer 21. A second dielectric layer 26 is then deposited, as shown in FIG. 2D, and an opening 27 formed therein. This opening 27 is illustrated in FIG. 2D as a via; however, embodiments of the present invention also include forming a dual damascene opening with a via leading to an upper trench section as subsequently discussed with respect to FIG. 3. Opening 27 in FIG. 2D stops at the upper α-Ta layer 25. Subsequently, as illustrated in FIG. 2E, a diffusion barrier layer 28, e.g., α-Ta, is deposited to line the opening, a seed layer (not shown) is deposited and the opening filled with Cu 29 by electrolytic deposition followed CMP resulting in the structure illustrated in FIG. 2E. Advantageously, since the deposited Ta diffusion barrier 28 grows on α-Ta layer 25, the α-Ta layer 25 serves as a template thereby resulting in the formation of an α-Ta liner 28 rather than a β-Ta liner.

Figure 3:
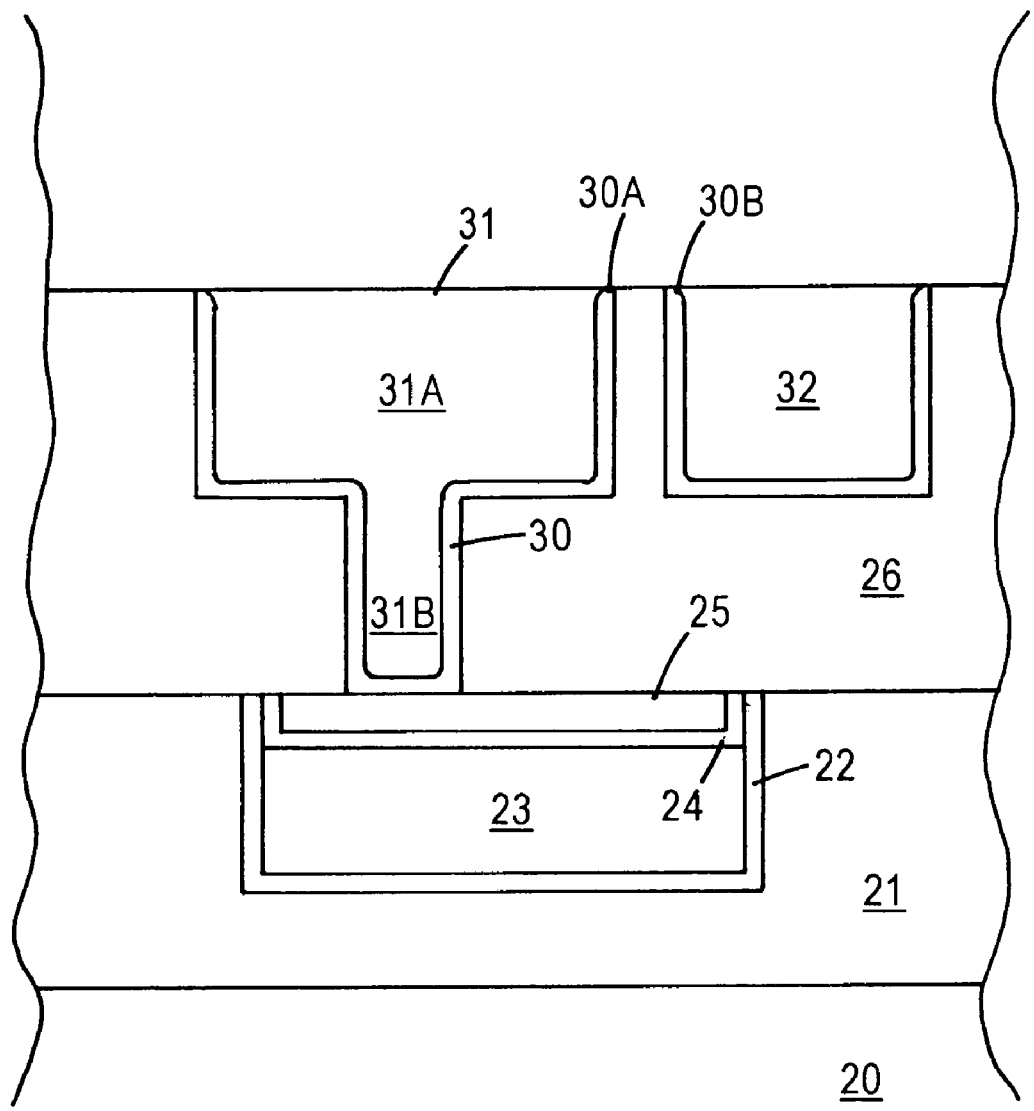
FIG. 3 schematically illustrates another embodiment of the present invention.

In another embodiment of the present invention, a dual damascene structure opening is formed in electrical contact with the upper surface with the α-Ta layer 25 as schematically illustrated in FIG. 3. The openings formed in dielectric layer 26 are then lined with Ta with an α-Ta diffusion barrier liner 30A and diffusion barrier layer 30B which may be Ta, filled with Cu followed by CMP resulting in the dual damascene structure 31 comprising upper line 31A in communication with a lower via 31B. Also illustrated in FIG. 3 is a separate line 32.

The present invention provides simplified methodology enabling the fabrication of semiconductor devices having reliably capped Cu interconnect exhibiting reduced via resistance and improved electromigration and stress migration performance in addition to reduced voiding under vias. The present invention achieves such benefits without requiring removal of the α-Ta portion of the composite capping layer thereby preventing copper contamination issues and via corner beveling.

Advantageously, dielectric materials for use as interlayer dielectrics in accordance with embodiments of the present invention can comprise dielectric materials with lower values of permittivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid siloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention enjoys industrial applicability in the fabricating of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details

What is claimed is:

1. A semiconductor device comprising:
   a first dielectric layer over a substrate;
   copper (Cu) or a Cu alloy inlaid in the first dielectric layer; and
   a composite capping layer on the inlaid Cu or Cu alloy;
   the composite capping layer comprising:
      a layer of tantalum nitride on the inlaid Cu or Cu alloy; and
      a layer of alpha (α)-Ta on the layer of tantalum nitride, wherein:
   the inlaid Cu or Cu alloy has an upper surface; and
   the composite capping layer encapsulates the inlaid Cu or Cu alloy along its entire upper surface.

2. The semiconductor device according to claim 1, wherein the composite capping layer is formed in a recess in the inlaid Cu or Cu alloy such that an upper surface of the α-Ta layer is substantially coplanar with an upper surface of the first dielectric layer.

3. The semiconductor device according to claim 2, wherein:
   the tantalum nitride layer has a thickness of 20 Å to 100 Å; and
   the α-Ta layer has a thickness of 200 Å to 500 Å.

4. The semiconductor device according to claim 3, further comprising:
   a second dielectric layer, having an opening therein, over the first dielectric layer; and
   a Cu or Cu alloy inlaid in the opening in the second dielectric layer in electrical contract with the upper surface of the α-Ta layer.

5. The semiconductor device according to claim 4, further comprising an α-Ta diffusion barrier lining the opening in the second dielectric layer.

6. The semiconductor device according to claim 4, wherein the opening is a dual damascene opening, the Cu or Cu alloy forming an interconnect comprising a lower via section and upper line.

7. The semiconductor device according to claim 2, further comprising: a diffusion barrier layer lining an opening in the first dielectric layer; and
   the Cu or Cu alloy inlaid in the opening.

8. The semiconductor device according to claim 1, wherein:
   the tantalum nitride layer has a thickness of 20 Å to 100 Å; and
   the α-Ta layer has a thickness of 200 Å to 500 Å.

9. The semiconductor device according to claim 1, wherein the layer of tantalum nitride is bonded to the upper surface of the inlaid Cu or Cu alloy at an interface containing Ta unreacted with the tantalum nitride.

10. A method of manufacturing a semiconductor device, the method comprising: forming an opening in a first dielectric layer;
    filling the opening with copper (Cu) or a Cu alloy; and
    forming a composite capping layer on an upper surface of the Cu or Cu alloy, the composite capping layer comprising:
       a layer of tantalum nitride on the upper surface of the Cu or Cu alloy; and
       a layer of alpha (α)-Ta on the layer of tantalum nitride, wherein
    the composite capping layer encapsulates the Cu or Cu alloy along its entire upper surface.

11. The method according to claim 10, comprising:
    forming a recess in the upper surface of the Cu or Cu alloy before forming the composite capping layer; and
    chemical mechanical polishing (CMP) such that an upper surface of the α-Ta layer is substantially coplanar with an upper surface of the first dielectric layer.

12. The method according to claim 11, comprising forming a diffusion barrier layer lining the opening before filling the opening with Cu or Cu alloy.

13. The method according to claim 11, comprising:
    forming the tantalum nitride at a thickness of 20 Å to 100 Å; and
    forming the α-Ta layer at a thickness of 200 Å to 500 Å.

14. The method according to claim 11, comprising depositing the tantalum nitride and α-Ta layers by physical vapor deposition (PVD).

15. The method according to claim 11, comprising:
    forming a second dielectric layer over the first dielectric layer;
    forming an opening in the second dielectric layer; and
    filling the opening in the second dielectric layer with Cu or Cu alloy in electrical contact with the upper surface of the α-Ta layer.

16. The method according to claim 15, comprising lining the opening of the second dielectric layer with an α-Ta diffusion barrier before filling the opening with Cu or a Cu alloy.

17. The method according to claim 10, comprising:
    forming the tantalum nitride layer at a thickness of 20 Å to 100 Å; and
    forming the α-Ta layer at a thickness of 200 Å to 500 Å.

18. The method according to claim 15, comprising:
    forming the opening in the second dielectric layer as a dual damascene opening; and
    filling the dual damascene opening with Cu or Cu alloy to form a interconnect comprising a lower via section in contact with an upper line.

19. The method according to claim 10, comprising depositing the layer of tantalum nitride under conditions wherein free Ta is generated, which free Ta participates in bonding the layer of tantalum nitride to the upper surface of the inlaid Cu or Cu alloy.

* * * * *